United States Patent
Abe et al.

(10) Patent No.: US 12,490,484 B2
(45) Date of Patent: Dec. 2, 2025

(54) SEMICONDUCTOR DEVICE

(71) Applicant: DENSO CORPORATION, Kariya (JP)

(72) Inventors: Emika Abe, Kariya (JP); Takuo Nagase, Kariya (JP); Ryota Miwa, Kariya (JP); Tomoo Morino, Kariya (JP)

(73) Assignee: DENSO CORPORATION, Kariya (JP)

( * ) Notice: Subject to any disclaimer, the term of this patent is extended or adjusted under 35 U.S.C. 154(b) by 455 days.

(21) Appl. No.: 18/147,046

(22) Filed: Dec. 28, 2022

(65) Prior Publication Data

US 2023/0138658 A1 May 4, 2023

Related U.S. Application Data

(63) Continuation of application No. PCT/JP2021/022464, filed on Jun. 14, 2021.

(30) Foreign Application Priority Data

Jul. 21, 2020 (JP) .................... 2020-124638

(51) Int. Cl.
*H10D 62/13* (2025.01)
*H02M 7/5387* (2007.01)
(Continued)

(52) U.S. Cl.
CPC ...... *H10D 62/157* (2025.01); *H02M 7/53871* (2013.01); *H10D 30/051* (2025.01); *H10D 64/513* (2025.01); *H10D 62/8325* (2025.01)

(58) Field of Classification Search
CPC .. H10D 30/051; H10D 62/157; H10D 64/513; H02M 7/53871
(Continued)

(56) References Cited

U.S. PATENT DOCUMENTS

2016/0322491 A1* 11/2016 Hirler .................. H10D 30/665
2016/0380563 A1    12/2016 Fukuta
(Continued)

FOREIGN PATENT DOCUMENTS

JP        2017-059920 A      3/2017
JP        2020109808 A  *   7/2020
(Continued)

*Primary Examiner* — Igwe U Anya
(74) *Attorney, Agent, or Firm* — Posz Law Group, PLC

(57) ABSTRACT

A semiconductor device includes a semiconductor element configured to form an upper-lower arm circuit of a power conversion device. The semiconductor element includes a control electrode, a high-potential electrode and a low-potential electrode. A parasitic capacitance between the control electrode and the high-potential electrode changes according to a potential difference between the high-potential electrode and the low-potential electrode. A value of the parasitic capacitance at a time when the potential difference is equal to 80 percent of a breakdown voltage of the semiconductor element is defined as a first capacitance value. An arbitrary value of the parasitic capacitance at a time when the potential difference is in an inclusive range of 20 percent to 40 percent of the breakdown voltage is defined as a second capacitance value. The first capacitance value is larger than the second capacitance value.

12 Claims, 7 Drawing Sheets

(51) Int. Cl.
*H10D 30/01* (2025.01)
*H10D 62/832* (2025.01)
*H10D 64/27* (2025.01)

(58) Field of Classification Search
USPC .......................................................... 257/330
See application file for complete search history.

(56) References Cited

U.S. PATENT DOCUMENTS

2018/0182885 A1   6/2018  Kobayashi
2019/0123187 A1*  4/2019  Tarumi ................... H10D 30/47
2020/0168732 A1   5/2020  Mitani et al.
2021/0005744 A1*  1/2021  Ebihara ................ H10D 62/111

FOREIGN PATENT DOCUMENTS

JP    2020109809 A  *  7/2020
WO    2016/042621 A1    3/2016

* cited by examiner

SEMICONDUCTOR DEVICE

CROSS REFERENCE TO RELATED APPLICATIONS

The present application is a continuation application of International Patent Application No. PCT/JP2021/022464 filed on Jun. 14, 2021, which designated the U.S. and claims the benefit of priority from Japanese Patent Application No. 2020-124638 filed on Jul. 21, 2020. The entire disclosures of all of the above applications are incorporated herein by reference.

TECHNICAL FIELD

The present disclosure relates to a semiconductor device.

BACKGROUND

A semiconductor device with a semiconductor element may be configured to form an upper-lower arm circuit of a power converter.

SUMMARY

The present disclosure describes a semiconductor device having a semiconductor element configured to form an upper-lower arm circuit of a power converter, and further describes the semiconductor element having a control electrode, a high-potential electrode and a low-potential electrode.

DETAILED DESCRIPTION

Figure 1:
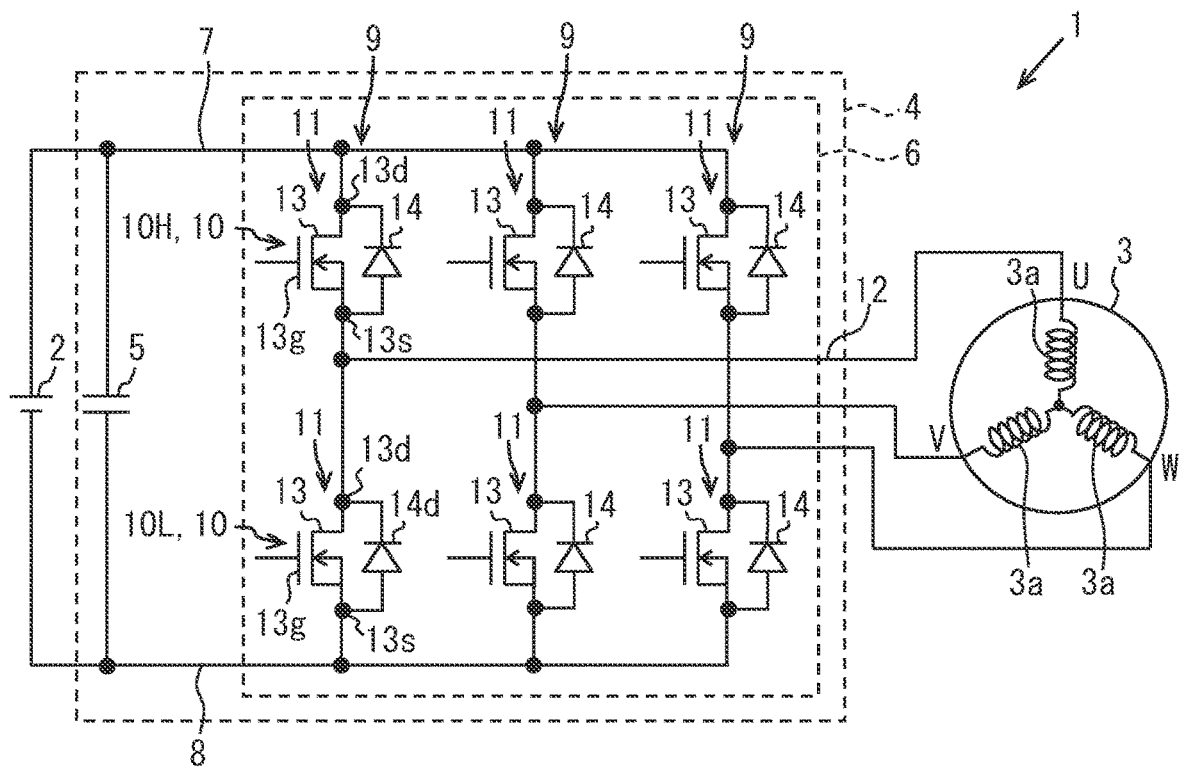
FIG. 1 illustrates a power converter to which a semiconductor device according to a first embodiment is applied.

In order to reduce a surge voltage that occurs at the time of turning off a semiconductor element, an external capacitor and a capacitance adjustment switching element may be required in addition to the semiconductor element. The capacitor may be connected in parallel with the parasitic capacitor between a control electrode and a high-potential main electrode of the semiconductor element. The capacitance adjustment switching element may be connected between the capacitor and the control electrode. However, this structure may lead to, for example, an increase of the physical size of the semiconductor device and the complexity of control.

According to a first aspect of the present disclosure, a semiconductor device includes a semiconductor element. The semiconductor element is configured to form an upper-lower arm circuit of a power conversion device. The semiconductor element has a control electrode, a high-potential electrode and a low-potential electrode. The high-potential electrode is at a higher potential than the low-potential electrode. Each of the high-potential electrode and the low-potential electrode is a main electrode. A parasitic capacitance between the control electrode and the high-potential electrode changes according to a potential difference between the high-potential electrode and the low-potential electrode. A value of the parasitic capacitance at a time when the potential difference is equal to 80 percent of a breakdown voltage of the semiconductor element is defined as a first capacitance value. An arbitrary value of the parasitic capacitance at a time when the potential difference is in an inclusive range of 20 percent to 40 percent of the breakdown voltage is defined as a second capacitance value. The first capacitance value is larger than the second capacitance value.

According to the semiconductor device disclosed herein, when the potential difference is equal to 80 percent of the breakdown voltage, the parasitic capacitance between the control electrode and the high-potential electrode has a value larger than any value at a time where the potential difference is in the inclusive range of 20 percent to 40 percent of the breakdown voltage. In other words, the value of the parasitic capacitance becomes larger in a region where the potential difference is larger, and becomes smaller in a region where the potential difference is smaller. Therefore, it is possible to reduce the turn-off loss while reducing the surge voltage with a simple structure.

According to a second aspect of the present disclosure, a semiconductor device includes a semiconductor element. The semiconductor element is included in an upper-lower arm circuit of a power conversion device. The semiconductor element includes a drain region, a low-concentration layer, a junction-gate field-effect transistor (JFET) portion, a current dispersion layer, a second-conductivity-type region, a source region, a gate electrode, a source electrode, and a drain electrode. The drain region is a first conductivity type. The low-concentration layer is located on the drain region and being the first conductivity type, and has a lower impurity concentration than the drain region. The JFET portion is located on the low-concentration layer and is the first conductivity type. The JFET portion extends in a first direction orthogonal to a thickness direction of the semiconductor element. The JFET portion has a width smaller than a width of the low-concentration layer in a second direction orthogonal to the thickness direction and the first direction. The current dispersion layer is located on the JFET portion and is the first conductivity type. The current dispersion layer has a width larger than the width of the JFET portion in the second direction. The second-conductivity-type region is a semiconductor region located on the low-concentration layer. The second-conductivity-type region is a second conductivity type and sandwiches the JFET portion in the second direction. The second-conductivity-type region is also located on the current dispersion layer while surrounding the current dispersion layer. The source region is located on the second-conductivity-type region and is the first conductivity type. The source region has a higher impurity concentration than the low-concentration layer. The gate electrode has a trench structure penetrating the source region and the second-conductivity-type region and reaching the current dispersion layer. The source electrode is electrically connected to the source region. The drain electrode is electrically connected to the drain region. The width of the JFET portion is equal to or larger than $591.53 \times BV^{-0.0997}$ and smaller than or equal to $278.52 \times BV^{-0.767}$, where BV denotes the breakdown voltage.

According to the semiconductor device disclosed herein, the JFET portion includes a structure having a smaller width and being sandwiched by the second-conductivity-type region. When the width of the JFET portion is set in the above-mentioned range, the portion of the second-conductivity-type region sandwiching the JFET portion is completely depleted based on a condition that the potential difference between the drain electrode and the source electrode is in the inclusive range of 40 percent to 80 percent of the breakdown voltage. Through the depletion, the parasitic capacitance between the gate electrode and the drain electrode suddenly increases. In other words, when the potential difference is equal to 80 percent of the breakdown voltage, the parasitic capacitance between the control electrode and the high-potential electrode has a value larger than any value at a time where the potential difference is in the inclusive range of 20 percent to 40 percent of the breakdown voltage. Therefore, it is possible to reduce the turn-off loss while reducing the surge voltage with a simple structure.

Hereinafter, multiple embodiments will be described with reference to the drawings. In some embodiments, parts that are functionally and/or structurally corresponding to each other and/or associated with each other are given the same reference numerals. For corresponding parts and/or associated parts, additional explanations can be made to the description of other embodiments.

A semiconductor device according to the present embodiment is applied to a power converter in a movable body adopting, for example, a rotating electrical machine as a drive source. The movable body is, for example, an electrically powered vehicle such as an electric vehicle (EV), a hybrid vehicle (HV), or a fuel cell vehicle (FCV), a flying body such as a drone, a ship, a construction machine, or an agricultural machine. In the following, an example applied to a vehicle will be described.

First Embodiment

Firstly, a schematic configuration of a vehicle drive system to which a power converter is applied will be described with reference to FIG. 1.

(Vehicle Drive System)

As shown in FIG. 1, a vehicle drive system 1 is provided with a direct current power supply 2, a motor generator 3, and a power converter 4.

The direct current power supply 2 is a direct current voltage source including a chargeable/dischargeable secondary battery. The secondary battery is, for example, a lithium ion battery or a nickel hydride battery. The motor generator 3 is a three-phase alternating current type rotating electric machine. The motor generator 3 functions as a vehicle driving power source, that is, an electric motor. The motor generator 3 functions also as a generator during regeneration. The power converter 4 performs electric power conversion between the direct current power supply 2 and the motor generator 3.

(Circuitry Structure of Power Converter)

Next, a circuit structure of the power converter 4 will be described with reference to FIG. 1. As shown in FIG. 1, the power converter 4 includes a smoothing capacitor 5, an inverter 6 as a power conversion device, in other words, a power conversion circuit.

The smoothing capacitor 5 mainly smoothens the DC voltage supplied from the direct current power supply 2. The smoothing capacitor 5 is connected between a P line 7 which is a power line on a high potential side and an N line 8 which is a power line on a low potential side. The P line 7 is connected to the positive electrode of the direct current power supply 2, and the N line 8 is connected to the negative electrode of the direct current power supply 2. The positive electrode of the smoothing capacitor 5 is connected to the P line 7 between the direct current power supply 2 and the inverter 6. Similarly, the negative electrode is connected to the N line 8 between the direct current power supply 2 and the inverter 6. The smoothing capacitor 5 is connected to the direct current power supply 2 in parallel.

The inverter 6 is a DC-AC converter. The inverter 6 converts the direct current voltage into a three-phase alternating current voltage according to the switching control by the control circuit (not shown) and outputs the three-phase alternating current voltage to the motor generator 3. Thereby, the motor generator 3 is driven to generate a predetermined torque. At the time of regenerative braking of the vehicle, the inverter 6 converts the three-phase alternating current voltage generated by the motor generator 3 by receiving the rotational force from wheels into a direct current voltage according to the switching control by the control circuit, and outputs the direct current voltage to the P line 7. In this way, the inverter 6 performs bidirectional power conversion between the direct current power supply 2 and the motor generator 3.

The inverter 6 includes upper-lower arm circuits 9 respectively for three phases. The upper-lower arm circuits 9 are also referred to as legs. Each of the upper-lower arm circuits 9 includes a semiconductor device 11 provided with at least one semiconductor element 10. Each of the upper-lower arm circuit 9 includes a semiconductor element 10H as the semiconductor element 10 at an upper arm side and a semiconductor element 10L as the semiconductor element 10 at a lower arm side. The semiconductor element 10H is connected at the P line 7 side while the semiconductor elements 10H, 10L are connected in series between the P line 7 and the N line 8. The connection node between the semiconductor elements 10H and 10L is connected to a winding 3a of a corresponding phase in the motor generator 3 via an output line 12. At least a part of the P line 7, the N line 8 and the output line 12 is made of a conductive member such as a bus bar.

In the present embodiment, the inverter 6 includes six semiconductor elements 10. The inverter 6 includes three semiconductor elements 10H and three semiconductor elements 10L. One semiconductor element 10 is included in one of six arms in the inverter 6.

The semiconductor element 10 includes a metal-oxide-semiconductor field-effect transistor (MOSFET) 13 as a switching element formed on a semiconductor substrate made of material such as silicon (Si) and a wide bandgap semiconductor having a wider bandgap than silicon. The MOSFET 13 is made such that a main current flows in a thickness direction of the semiconductor substrate. A main electrode is formed on each of the respective plate surfaces of the semiconductor substrates. Examples of wide bandgap semiconductors include silicon carbide (SiC), gallium nitride (GaN), gallium oxide ($Ga_2O_3$) and diamond.

In the present embodiment, the semiconductor element 10 is formed with the n-channel MOSFET 13 on a SiC substrate. The semiconductor element 10 includes a gate electrode 13g, a drain electrode 13d and a source electrode 13s. The gate electrode 13g is a control electrode, and each of the drain electrode 13d and the source electrode 13s is a main electrode. The drain electrode 13d corresponds to a high-potential electrode, and the source electrode 13s corresponds to a low-potential electrode. A freewheeling diode 14 is connected in anti-parallel to each of the MOSFETs 13. The diode 14 may be a parasitic diode (i.e., a body diode) of the MOSFET 13 or may be provided separately from the parasitic diode. The anode of the diode 14 is connected to the source electrode 13s of the corresponding MOSFET 13, and the cathode is connected to the drain electrode 13d.

In the semiconductor element 10H at the upper arm side, the drain electrode 13d is connected to the P line 7. In the semiconductor element 10L at the lower arm side, the source electrode 13d is connected to the N line 8. The source electrode 13s of the semiconductor element 10H and the drain electrode 13d of the semiconductor element 10L are mutually connected.

In the present embodiment, one semiconductor device 11 includes one semiconductor element 10. The power converter 4 includes six semiconductor devices 11 included in the inverter 6. Alternatively, the semiconductor device 11 may include two semiconductor elements 10H, 10L mutually connected in series in the upper-lower arm circuit 9. The semiconductor device 11 may include all semiconductor elements 10 in the inverter 6. The semiconductor device 11 may include multiple semiconductor elements 10 mutually connected in parallel in one arm.

The power converter 4 may include a drive circuit of the MOSFET 13 in the inverter 6. The drive circuit supplies a drive voltage to the gate of the MOSFET 13 of the corresponding arm based on the drive command of the control circuit. The drive circuit drives the corresponding MOSFET 13 by applying a drive voltage to turn on and off the drive of the corresponding MOSFET 13. The drive circuit may also be referred to as a driver.

The power converter 4 may include a control circuit of the MOSFET 13. The control circuit generates a drive command for operating the MOSFET 13 and outputs the drive command to the drive circuit. The control circuit generates the drive command based on a torque request input from a higher-level ECU (not shown) or signals detected by various sensors.

Various sensors include, for example, a current sensor, a rotation angle sensor, and a voltage sensor. The current sensor detects the phase current flowing through the winding 3a of each phase. The rotation angle sensor detects the rotation angle of the rotor of the motor generator 3. The voltage sensor detects the voltage across the smoothing capacitor 5. The control circuit outputs, for example, a PWM signal as the drive command. The control circuit includes, for example, a microcomputer. ECU is an abbreviation for Electronic Control Unit. PWM is an abbreviation for Pulse Width Modulation.

(Characteristic of Element)

Figure 2:
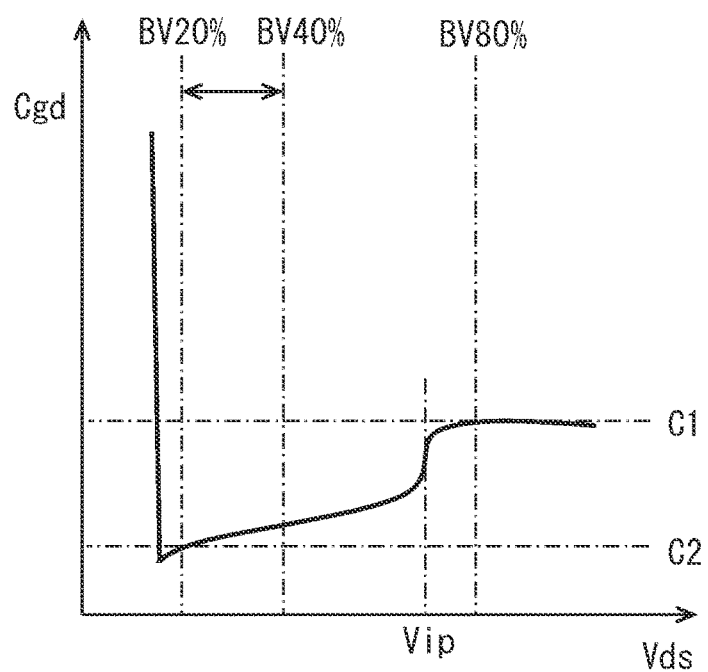
FIG. 2 illustrates a characteristic of Vds-Cgd of a semiconductor element in the semiconductor device according to the first embodiment.
Figure 3:
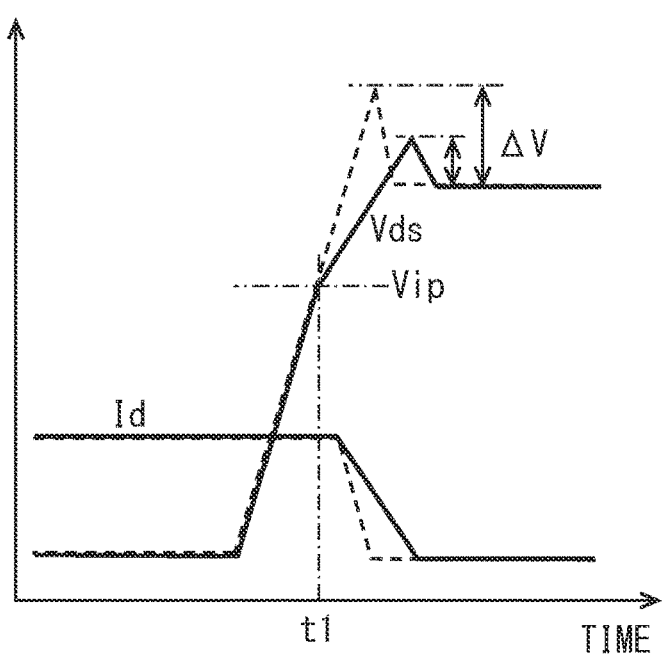
FIG. 3 illustrates a switching waveform at a time of turn-off.
Figure 4:
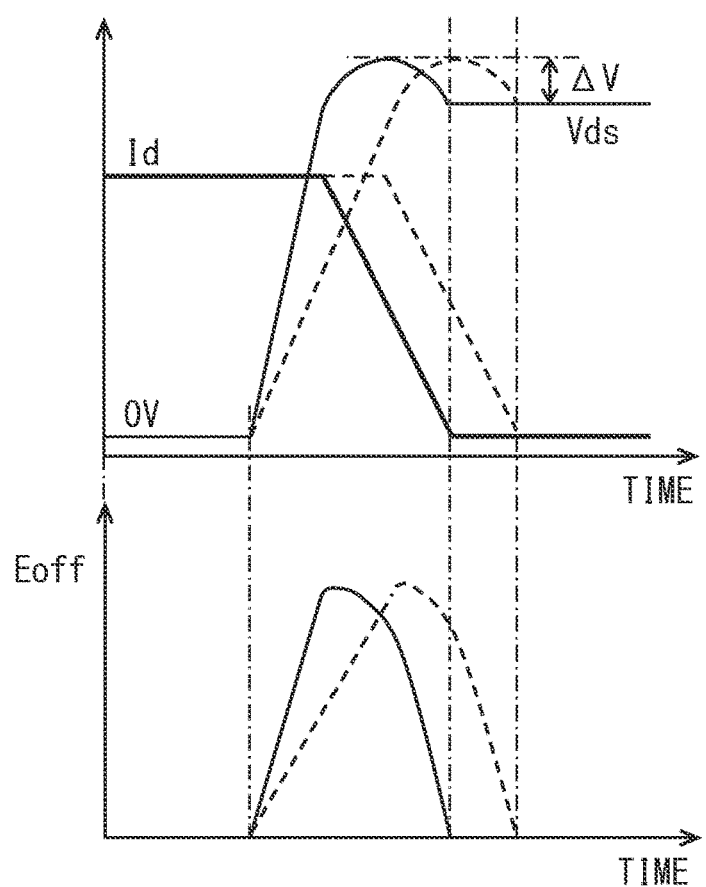
FIG. 4 illustrates two switching waveforms with different ratios C1/C2.
Figure 5:
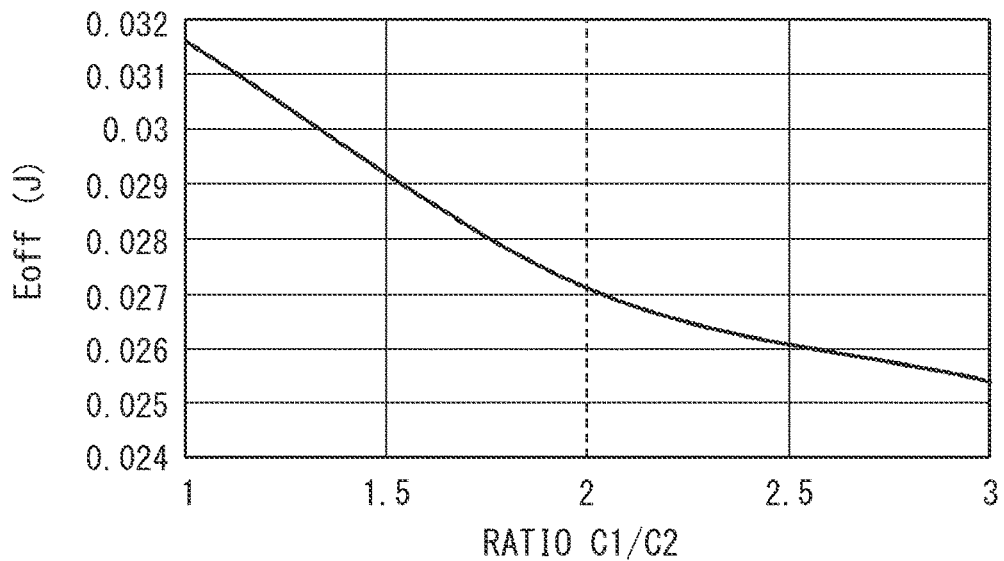
FIG. 5 illustrates the relationship between the ratio C1/C2 and turn-off loss Eoff.

The following describes the characteristics of the semiconductor element 10, in other words, the MOSFET 13 included in the semiconductor device 11 according to the present embodiment with reference to FIGS. 2 to 5. FIG. 2 illustrates a Vds-Cgd characteristic. FIG. 3 illustrates a switching waveform at the time of turn-off. FIG. 4 illustrates the relationship between a ratio C1/C2 and a switching waveform. FIG. 5 illustrates the relationship between the ratio C1/C2 and turn-off loss Eoff.

Vds illustrated in the drawing is the voltage between the drain and the source. The voltage Vds corresponds to a potential difference between a high-potential electrode and a low-potential electrode. Cgd indicates the capacitance, in other words, the parasitic capacitance between the gate and the drain. The capacitance Cgd is also referred to as a feedback capacitance. Id indicates the drain current. $\Delta V$ indicates the surge voltage. Each of FIGS. 2, 3 and 5 illustrates a simulation result. FIG. 3 illustrates the simplification of the simulation result. In FIG. 3, for example, BV 80% indicates the value of 80% of a breakdown voltage BV. FIG. 4 illustrates two levels for the ratio C1/C2, and illustrates a switching waveform at the time of turning off for each level. In FIG. 4, the value of the gate resistance is adjusted such that the surge voltages $\Delta V$ are equal.

In the present embodiment, the MOSFET 13, in other words, a SiC-MOSFET of the semiconductor element 10 has a feature in which the capacitance Cgd changes according to the voltage Vds, as illustrated in FIG. 2. The value of the capacitance C1 is larger than the value of the capacitance C2. The capacitance Cgd changes suddenly at a time where the voltage Vds reaches a predetermined voltage Vip. For example, when the voltage Vds rises and reaches the voltage Vip, the capacitance Cgd suddenly increases. The voltage Vip is sometimes referred to as an inflection point voltage. According to the above feature, it is possible to reduce the surge voltage generated at the time of the turn-off.

In FIG. 3, a solid line indicates a switching waveform according to the present embodiment. A broken line indicates a switching waveform according to a reference example. In the reference example, the MOSFET of the semiconductor element includes a substantially feature in which the capacitance Cgd does not change according to the voltage Vds. In other words, the MOSFET of the semiconductor element includes a feature in which the respective values of the capacitances C1 and C2 are equal.

At the time of the turn-off, the surge voltage $\Delta V$ is superimposed on voltage Vds. A voltage Vds increased by the surge voltage $\Delta V$ is applied to the semiconductor element, in other words, the MOSFET. The surge voltage $\Delta V$ is the product of the switching speed di/dt and the parasitic inductance Ls of the main circuit. The switching speed di/dt is the amount of change in the current Id per unit time, and is also referred to as a current slope. In the structure according to the reference example indicated by a broken line, when the switching speed di/dt is enlarged to reduce the switching loss, in other words, the turn-off loss, the surge voltage $\Delta V$ also increases.

As indicated by the solid line, in the semiconductor element 10, in other words, the MOSFET 13 according to the present embodiment, when the voltage Vds reaches the voltage Vip at a time t1, the capacitance Cgd suddenly increases according to the above feature. Accordingly, the switching speed Di/dt is smaller than the reference example. Since the current Id changes gradually, the surge voltage can be made smaller than the reference example. Therefore, the voltage Vds on which the surge voltage $\Delta V$ is superimposed can be prevented from exceeding the element's breakdown voltage.

The rising waveform of the voltage Vds makes a large contribution to the turn-off loss. When the rise of the voltage Vds slows down, the turn-off loss increases. As shown in FIG. 3, the rising waveform of the voltage Vds in the present embodiment is equivalent to the reference example in which the capacitance Cgd does not change. It is possible to reduce the turn-off loss as compared with the structure in which the voltage Vds rises slowly. Therefore, it is possible to reduce the turn-off loss while reducing the surge voltage ΔV by reducing the switching speed di/dt.

The following describes the voltage Vip and the voltage Vds corresponding to the value of capacitances C1, C2.

It may be preferable that the voltage Vip is set to be smaller than or equal to 80% of a voltage BV. When the device characteristics such as a gate threshold voltage and a gate input capacitance affecting the switching speed di/dt vary due to process variation, in other words, manufacturing variation, the surge voltage ΔV also varies. When the voltage Vip exceeds 80% of the voltage BV, the voltage Vds on which the surge voltage ΔV is superimposed may exceed the voltage BV due to the variation in the above-mentioned surge voltage ΔV.

When the voltage Vip is set to be smaller than or equal to 80% of the voltage BV, even though the surge voltage ΔV varies, it is possible to prevent the voltage Vds on which the surge voltage ΔV is superimposed from reaching the voltage BV. This effect has been confirmed by simulation.

In the present embodiment, the capacitance Cgd suddenly changes when the value of the voltage Vds is smaller than or equal to 80% of the voltage BV. The capacitance value C1 is a value of the capacitance Cgd at a time when the voltage Vds is equal to a value of 80% of the voltage BV, and is larger than the capacitance value C2. The capacitance value C1 corresponds to a first capacitance value.

It may be preferable that the region of the voltage Vds in which the capacitance Cgd is relatively small is an inclusive range of 20% to 40% of the voltage BV. When the capacitance Cgd has a relatively small value in the inclusive range of 20% to 40% of the voltage BV, the voltage Vds rises suddenly and the turn-off loss can be reduced. This effect has been confirmed by simulation. The capacitance value C2 is set to be an arbitrary value taken by the capacitance Cgd in a range where the voltage Vds is 20% to 40% of the voltage BV. In the voltage region, the capacitance Cgd does not change significantly, and exhibits a substantially constant value. The maximum value of the capacitance Cgd in an inclusive range of 20% to 40% of the voltage BV is a sufficiently small value compared to the capacitance value C1. The capacitance value C2 corresponds to a second capacitance value.

The following describes the ratio C1/C2 of the capacitance value C1 to the capacitance value C2.

FIG. 4 illustrates that the ratio C1/C2 for the solid line is larger than the ratio C1/C2 for the broken line. In a structure in which the surge voltages ΔV are equal, the voltage Vds rises suddenly at the time of the turn-off as the ratio C1/C2 increases. That is, the turn-off loss can be reduced as the ratio C1/C2 increases. This effect is remarkable based on the simulation result illustrated in FIG. 5. It is possible to effectively reduce the turn-off loss Eoff, when the ratio C1/C2 is two or larger in particular. A change in the turn-off loss with respect to a change in the ratio of C1/C2 is smaller in a situation where the value of the ratio C1/C2 is 2 or larger than in a situation where the value of the ratio C1/C2 is smaller than 2. Accordingly, it may be preferable to set the ratio C1/C2 to 2 or larger.

(Structure of Semiconductor Device)

Figure 6:
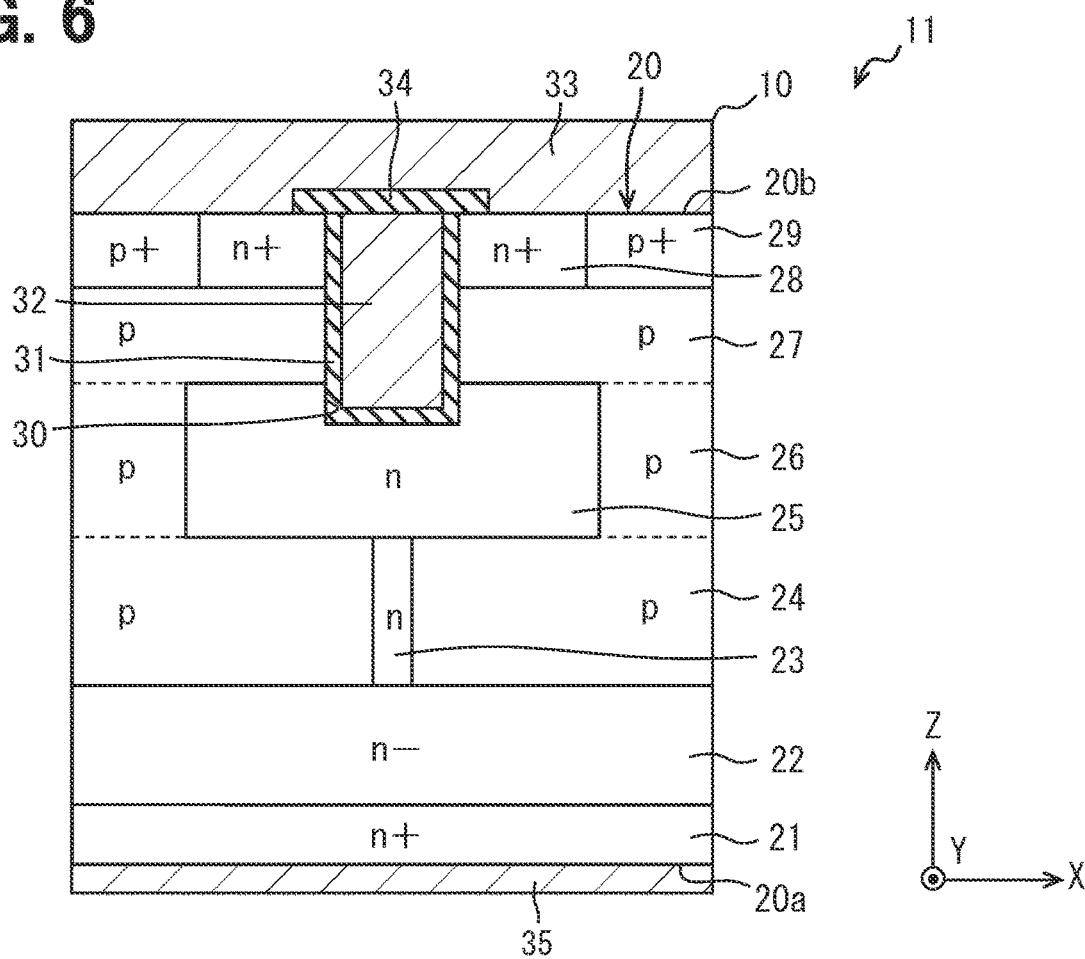
FIG. 6 is a cross-sectional view that illustrates a structure of the semiconductor element included in the semiconductor device.
Figure 7:
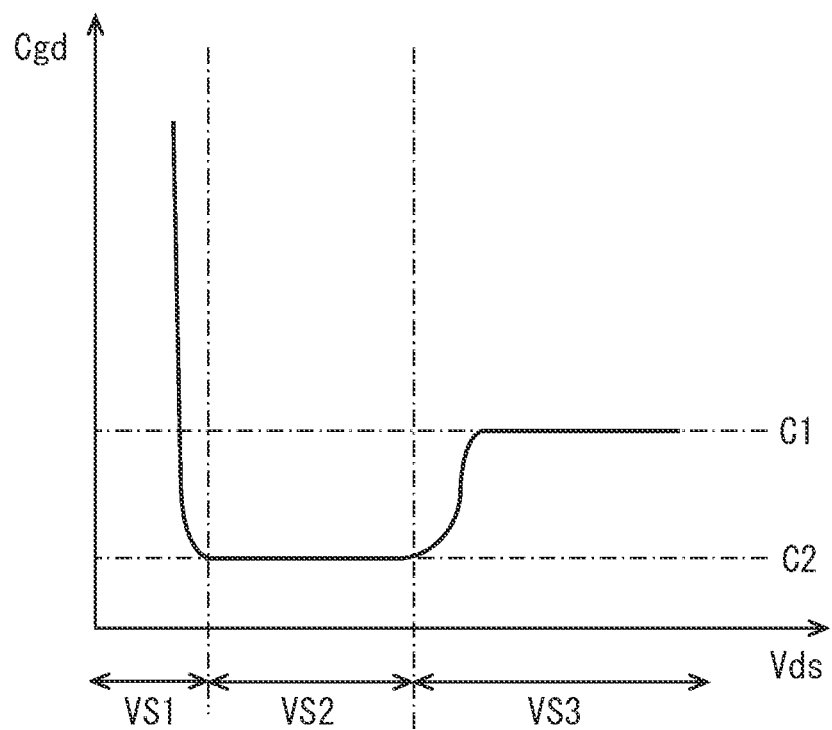
FIG. 7 illustrates a turn-off operation and a change in a capacitance Cgd.
Figure 8:
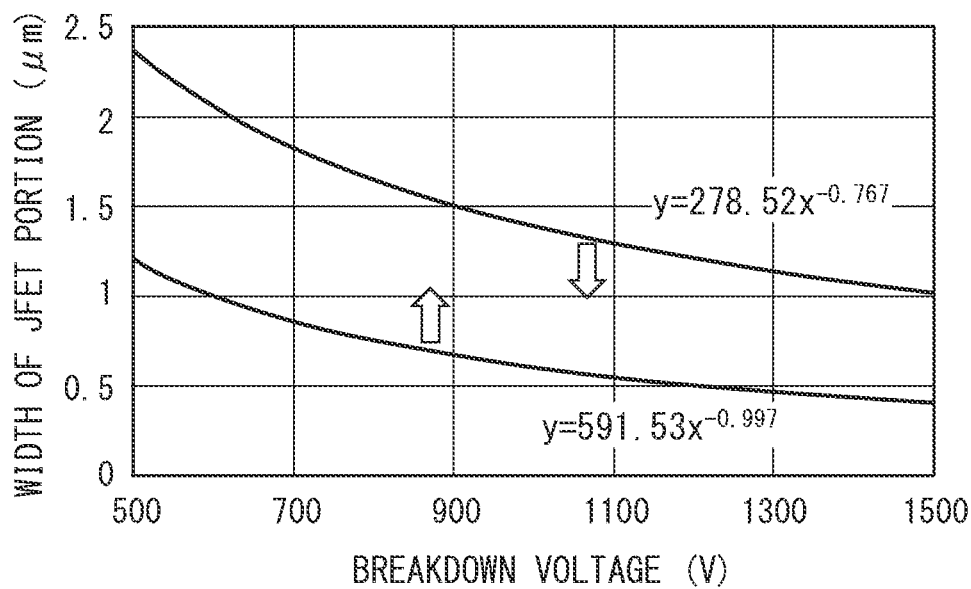
FIG. 8 illustrates the relationship between a breakdown voltage BV and a width of a JFET portion.

The following describes the structure of the semiconductor device 11, in other words, the semiconductor element 10 having the above characteristics with reference to FIGS. 6 to 8. FIG. 6 is a cross-sectional view of a semiconductor device 11 according to the present embodiment. FIG. 6 illustrates a portion of a cell region. FIG. 7 illustrates a turn-off operation and a change in the capacitance Cgd. FIG. 8 illustrates the relationship between the voltage BV and a width of a JFET portion. FIG. 8 illustrates the results of a test element group (TEG), in other words, the results of actual measurements.

Hereinafter, a thickness direction of the semiconductor element 10, in other words, a semiconductor substrate is defined as a Z direction. An extending direction of a trench that is orthogonal to the Z direction is referred to as a Y direction. A direction orthogonal to both the Z direction and the Y direction is defined as an X direction. A plan view in the Z direction is simply referred to as a plan view unless otherwise specified. The length of the JFET portion in the Z direction and a direction orthogonal to the extending direction of the JFET portion is referred to as a width. In the present embodiment, an n-type corresponds to a first conductivity type, and a p-type corresponds to a second conductivity type.

As shown in FIG. 6, the semiconductor device 11 includes the semiconductor element 10. The semiconductor element 10 is formed with the MOSFET 13 having a vertical structure on a semiconductor substrate 20 made of SiC as the material. The vertical structure is a structure in which the main current flows in the Z direction as the thickness direction of the semiconductor substrate 20. The MOSFET 13 is formed at the cell region of the semiconductor substrate 20. The cell region is also referred to as a main region or an active region. The semiconductor substrate 20 is also referred to as a semiconductor chip.

The semiconductor substrate 20 includes a SiC substrate 21, a low-concentration layer 22, a junction-gate field-effect transistor (JFET) portion 23, a deep layer 24, a current dispersion layer 25, a coupling layer 26, a base region 27, a source region 28, and a base contact region 29. The semiconductor substrate 20 is formed by forming semiconductor layers and semiconductor regions made of SiC on the SiC substrate 21 by, for example, epitaxial growth or ion implantation of impurity. The semiconductor layer and the semiconductor region are sometimes referred to as a diffusion layer. The semiconductor substrate 20 includes a main surface 20a and a rear surface 20b on a side opposite from the main surface 20a in the Z direction.

The SiC substrate 21 forms the main surface 20a of the semiconductor substrate 20. The SiC substrate 21 is an n-type (n+) substrate made of SiC as the material, and has a higher impurity concentration than the low-concentration layer 22, the JFET portion 23 and the current dispersion layer 25. The SiC substrate 21 functions as the drain region of the MOSFET 13.

The low-concentration layer 22 is formed on a surface on a side opposite from the main surface 20a at the SiC substrate 21. The low-concentration layer 22 is an n-type (n−) semiconductor layer made of SiC as the material, and has a lower impurity concentration than the SiC substrate 21, the JFET portion 23 and the current dispersion layer 25.

The JFET portion 23 is formed on a surface of the low-concentration layer 22 on a side opposite from another surface of the low-concentration layer 22 near the SiC substrate 21. The JFET portion 23 is an n-type (n) semiconductor layer that is made of SiC as the material, and that has a lower impurity concentration than the SiC substrate 21 and has a higher impurity concentration than the low-concentration layer 22. The JFET portion 23 extends in a direction orthogonal to the Z direction, and has a stripe shape, in other words, a linear shape in the plan view.

In the present embodiment, the JFET portion 23 extends in a direction identical to the extending direction of a trench 30, in other words, the Y direction. The JFET portion has a width narrower than the low-concentration layer 22 and the current dispersion layer 25 in a direction (the X direction) orthogonal to the extending direction. Therefore, the Y direction corresponds to a first direction. The X direction corresponds to a second direction.

The deep layer 24, as similar to the JFET portion 23, is formed on a surface of the low-concentration layer 22 on a side opposite from another surface of the low-concentration layer 22 near the SiC substrate 21. The deep layer 24 is a p-type (p) semiconductor layer made of SiC as the material. The deep layer 24 extends in the same direction as the JFET portion 23. The deep layer 24 is formed on both sides of the JFET portion 23 in a direction orthogonal to the extending direction of the JFET portion 23 and the Z direction. The deep layer 24 is formed around the JFET portion 23, and has a stripe shape.

In the present embodiment, the deep layer 24 extends in the Y direction. The deep layer 24 sandwiches the JFET portion 23 in the X direction. The respective widths of the sections of the deep layer 24 on both sides of the JFET portion 23 are larger than the width of the JFET portion 23.

The current dispersion layer 25 is a layer that causes the current flowing through the channel region as described later to be distributed in the X direction, in other words, a width direction. The current dispersion layer 25 is formed on a surface of each of the JFET portion 23 and the deep layer 24 on a side opposite from another surface of each of the JFET portion 23 and the deep layer 24 near the low-concentration layer 22. The current dispersion layer 25 is an n-type (n) semiconductor layer that is made of SiC as the material, and that has a lower impurity concentration than the SiC substrate 21 and has a higher impurity concentration than the low-concentration layer 22.

The current dispersion layer 25 is formed directly above a section of the deep layer 24 located on both sides of the JFET portion 23 to a location directly above the other section of the deep layer 24 across the JFET portion 23. The width of the current dispersion layer 25 is larger than the width of the JFET portion 23. The current dispersion layer 25 continues to the SiC substrate 21 through the JFET portion 23 and the low-concentration layer 22. The current dispersion layer 25 functions as a drift layer together with the low-concentration layer 22 and the JFET portion 23.

The coupling layer 26 is formed on a surface of the deep layer 24 on a side opposite from another surface of the deep layer 24 near the low-concentration layer 22. The coupling layer 26 is a p-type (p) semiconductor layer made of SiC as the material. The coupling layer 26 is formed on both sides of the current dispersion layer 25 in the X direction. The width of the coupling layer 26 is smaller than the width of the deep layer 24.

The base region 27 is formed on a surface of each of the current dispersion layer 25 and the coupling layer 26 on a side opposite from another surface of each of the current dispersion layer 25 and the coupling layer 26 near the deep layer 24. The base region 27 is a p-type semiconductor layer made of SiC as the material. The base region 27 is continuous with the deep layer 24 through the coupling layer 26.

The source region 28 is formed on a surface of the base region 27 on a side opposite from another surface of the baser region 27 near the current dispersion layer 25. The source region 28 is an n-type (n+) semiconductor region made of SiC as the material, and has a higher impurity concentration than the low-concentration layer 22, the JFET portion 23 and the current dispersion layer 25. The source region 28 is formed at a position overlapping the current dispersion layer 25 in the plan view.

A base contact region 29 is formed on a surface of the base region 27 on a side opposite to another surface of the base region 27 near the current dispersion layer 25. The base contact region 29 is a p-type (p+) semiconductor region made of SiC as the material, and has a higher impurity concentration than the base region 27. The base contact region 29 is formed at a position overlapping the coupling layer 26 in the plan view. Each of the base contact region 29, the base region 27, the coupling layer 26 and the deep layer 24 corresponds to a second-conductivity-type region.

A trench 30 is formed at the semiconductor substrate 20 constructed as described above. The trench 30 is formed with a predetermined depth from the rear surface 20b side. The trench 30 penetrates the source region 28 and the base region 27 and reaches the current dispersion layer 25. Each of the base region 27 and the source region 28 is formed to be in contact with the side surface of the trench 30. The trench 30 extends in the Y direction. Although not shown, multiple trenches 30 are formed at the semiconductor substrate 20. Multiple trenches 30 are arranged at regular intervals in the X direction, and form a stripe shape in the plan view.

A gate insulating film 31 is formed on the wall surface of the trench 30. A gate electrode 32 is formed at the surface of the gate insulating film 31 to embed the trench 30. The gate electrode 32 penetrates the source region 28 and the base region 27 and reaches the current dispersion layer 25.

A source electrode 33 is formed on the rear surface 20b of the semiconductor substrate 20. The source electrode 33 is formed at the cell region. The source electrode 33 is electrically connected to the source region 28 and the base contact region 29. The source electrode 33 is electrically separated from the gate electrode 32 through an interlayer insulating film 34. A pad (not shown) being a signal electrode is also formed on the rear surface 20b of the semiconductor substrate 20. The pad includes, for example, a pad for the gate electrode 32.

A drain electrode 35 is formed on the main surface 20a of the semiconductor substrate 20. The drain electrode 35 is formed on almost the entire surface of the main surface 20a. The drain electrode 35 is electrically connected to the SiC substrate 21.

An n-channel MOSFET with a vertical structure is formed at the semiconductor substrate 20. A cell region is formed on the semiconductor substrate 20 by placing the MOSFET cells. An outer peripheral breakdown-voltage portion (not shown) such as a guard ring is formed at the semiconductor substrate 20 to surround the cell region in the plan view.

The semiconductor element 10, in other words, the semiconductor device 11 according to the present embodiment executes a turn-on operation by applying a gate voltage of, for example, 20 V in a state where a drain voltage is set to, for example, 1 to 1.5 V. By applying the gate voltage, a channel region is formed at a base region 27 in contact with the gate insulating film 31 and the current flows between the drain electrode 35 and the source electrode 33 in the MOSFET.

The semiconductor element 10 executes a turn-off operation by applying the gate voltage smaller than or equal to a threshold voltage to the gate electrode 32. In the present embodiment, the JFET portion 23 has a structure with a narrow width sandwiched by the deep layer 24, the JFET portion 23 functions as a depletion adjustment layer, and the deep layer 24 functions as a potential adjustment layer at the time of the turn-off.

The following describes the turn-off operation and a change in the capacitance Cgd. FIG. 7 illustrates that the voltage Vds is divided into three sections. A second voltage section VS2 has a higher voltage than a first voltage section VS1, and a third voltage section VS3 has a higher voltage than a second voltage section VS2.

In the first voltage section VS1, the depletion layer does not spread to the diffusion layer in a state of Vds=0V, in other words, a full-on state. Therefore, the capacitance Cgd has a capacitance value identical to the capacitance value of the gate insulating film 31, and has a large capacitance value.

When the turn-off begins and then the voltage Vds rises, the depletion layer spreads between the current dispersion layer 25 and the base region 27. Since the capacitance of the depletion layer is added in series to the capacitance of the gate insulating film 31, the value of the capacitance Cgd suddenly decreases.

In the second voltage section VS2, the voltage Vds further rises with respect to the first voltage section VS1. When the voltage Vds rises to a predetermined value being 20% or less of the voltage BV, for example, a value slightly fewer than 20% of the voltage BV, the depletion layer extending to the JFET portion 23 from the deep layer 24 extends to be longer than the width of the JFET portion 23, and the JFET portion 23 is pinched off. The voltage Vds applied to the gate insulating film 31 is shielded by the depletion layer extending to the JFET portion 23. Since the JFET portion 23 with a narrow width is sandwiched by the deep layer 24, it is possible to enhance the shield effect. With the shield effect, even when the voltage Vds rises in the second voltage section VS2, the value of the capacitance Cgd remains low.

In the third voltage section VS3, the voltage Vds further rises with respect to the second voltage section VS2. When the voltage Vds rises to the inflection point voltage Vip, the deep layer 24 is completely depleted and the shield effect is lost. As a result, the potential of the gate insulating film 31 rises, and the capacitance Cgd suddenly increases. By setting the inflection point voltage Vip to be smaller than or equal to 80% of the voltage BV, it is possible to effectively inhibit the surge voltage $\Delta V$ at the time of the turn-off as described above.

The following describes the width of the JFET portion 23. In the following mathematical expression, a variable x denotes the voltage BV (V), and y denotes the width (μm) of the JFET portion 23.

As a result of actual measurement, when the inflection point voltage Vip is 80% of the voltage BV (V), it is obvious that the relationship between the voltage BV and the width of the JFET portion 23 can be approximated by the mathematical expression of $y=591.53x^{-0.997}$.

By setting the width of the JFET portion 23 to be larger than or equal to the relation of $591.53 \times BV^{-0.997}$, it is possible to set the inflection point voltage Vip to be smaller than or equal to 80% of the voltage BV. In other words, the capacitance Cgd at the time of the voltage Vds being 80% of the voltage BV can be set to a large value, in other words, the capacitance value C1.

In addition, when the inflection point voltage Vip is 40% of the voltage BV (V), it is obvious that the relationship between the voltage BV and the width of the JFET portion 23 can be approximated by the mathematical expression of $y=278.52x^{-0.767}$.

By setting the width of the JFET portion 23 to be smaller than or equal to the relation of $278.52 \times BV^{-0.767}$, it is possible to set the inflection point voltage Vip to be smaller than or equal to 40% of the voltage BV. In other words, the capacitance Cgd at the time of the voltage Vds being 20% to 40% of the voltage BV can be set to a small value, in other words, the capacitance value C2.

The semiconductor device 11, in other words, the semiconductor element 10 according to the present embodiment can reduce the turn-off loss, in other words, the switching loss while reducing the surge voltage $\Delta V$ with the above element configuration with a simple structure.

Summary of First Embodiment

According to the semiconductor device 11 in the present embodiment, the semiconductor element 10, in other words, the MOSFET 13 has a feature in which the value of the capacitance Cgd changes according to the voltage Vds. In particular, the value C1 of the capacitance Cgd at the time of the voltage Vds being 80% of the voltage BV is larger than an arbitrary value C2 of the capacitance Cgd at the time of the voltage Vds being in a range of 20% to 40% of the voltage BV. In other words, the inflection point voltage Vip at which the capacitance Cgd suddenly changes is in an inclusive range of 40% to 80% of the voltage BV.

In a region where the voltage Vds is large, the value of the capacitance Cgd becomes larger. Therefore, the switching speed di/dt becomes smaller. Therefore, the surge voltage $\Delta V$ can be reduced. In a region where the voltage Vds is small, the value of the capacitance Cgd becomes smaller. Therefore, the rising waveform of the voltage Vds becomes steeper. Therefore, the turn-off loss can be reduced. Even though a capacitance element or a switching element for capacitance adjustment is not externally provided for the semiconductor element 10, the value of the capacitance Cgd at the time of turn-off changes due to the element characteristics. As described above, it is possible to reduce the turn-off loss while reducing the surge voltage with a simple structure.

The capacitance value C1 may be any value as long as it is greater than the capacitance value C2. In other words, the ratio C1/C2 should be at least greater than one. In the present embodiment, the ratio C1/C2 is two or larger. It is possible to effectively reduce the turn-off loss as described above, when the ratio C1/C2 is two or larger in particular.

In the present embodiment, the semiconductor element 10 has the JFET portion 23 with a narrow width sandwiched by the deep layer 24, in other words, the second-conductivity-type region. The width of the JFET portion 23 is set to be larger than or equal to $591.53 \times BV^{-0.997}$. As a result, the deep layer 24 is completely depleted and the capacitance Cgd suddenly increases in a situation where the value of the voltage Vds is smaller than or equal to 80% of the voltage BV. Accordingly, the value C1 of the capacitance Cgd at the time of the voltage Vds being 80% of the voltage BV can be set to a large value. In other words, it is possible to reduce the surge voltage $\Delta V$ at the time of the turn-off.

The inflection point voltage Vip decreases as the width of the JFET portion 23 increases. The width of the JFET portion 23 is set to be smaller than or equal to $278.52 \times BV^{-0.767}$. As a result, the deep layer 24 is completely depleted and the capacitance Cgd suddenly increases in a situation where the value of the voltage Vds is larger than or equal to 40% of the voltage BV. Accordingly, with the shield effect, the arbitrary value C2 of the capacitance Cgd can be set to a value smaller than the capacitance value C1, in a situation where the voltage Vds is 20% to 40% of the voltage BV. In other words, the turn-off loss can be reduced.

The material for the semiconductor substrate 20 is not particularly limited. For example, Si may be used. As described above, SiC is adopted in the present embodiment. A wide bandgap semiconductor such as SiC has a dielectric breakdown electric field strength about an extra digit higher than a silicon semiconductor. As a result, the breakdown voltage and the amount of carriers can be increased by about an extra digit compared to the silicon semiconductor. Since an increase in the amount of the carriers lowers a resistance (on-resistance) value during conduction, it is possible to acquire the semiconductor device with smaller conduction loss and higher breakdown voltage.

In a high voltage region where the silicon semiconductor cannot be adopted, it is possible to adopt the wide bandgap semiconductor having a unipolar device structure with high-speed switching. Although the high-speed switching reduces the switching loss, the surge voltage is easily generated. Therefore, by applying the structure described in the present embodiment, it is possible to further enhance the effect.

(Modification)

Figure 9:
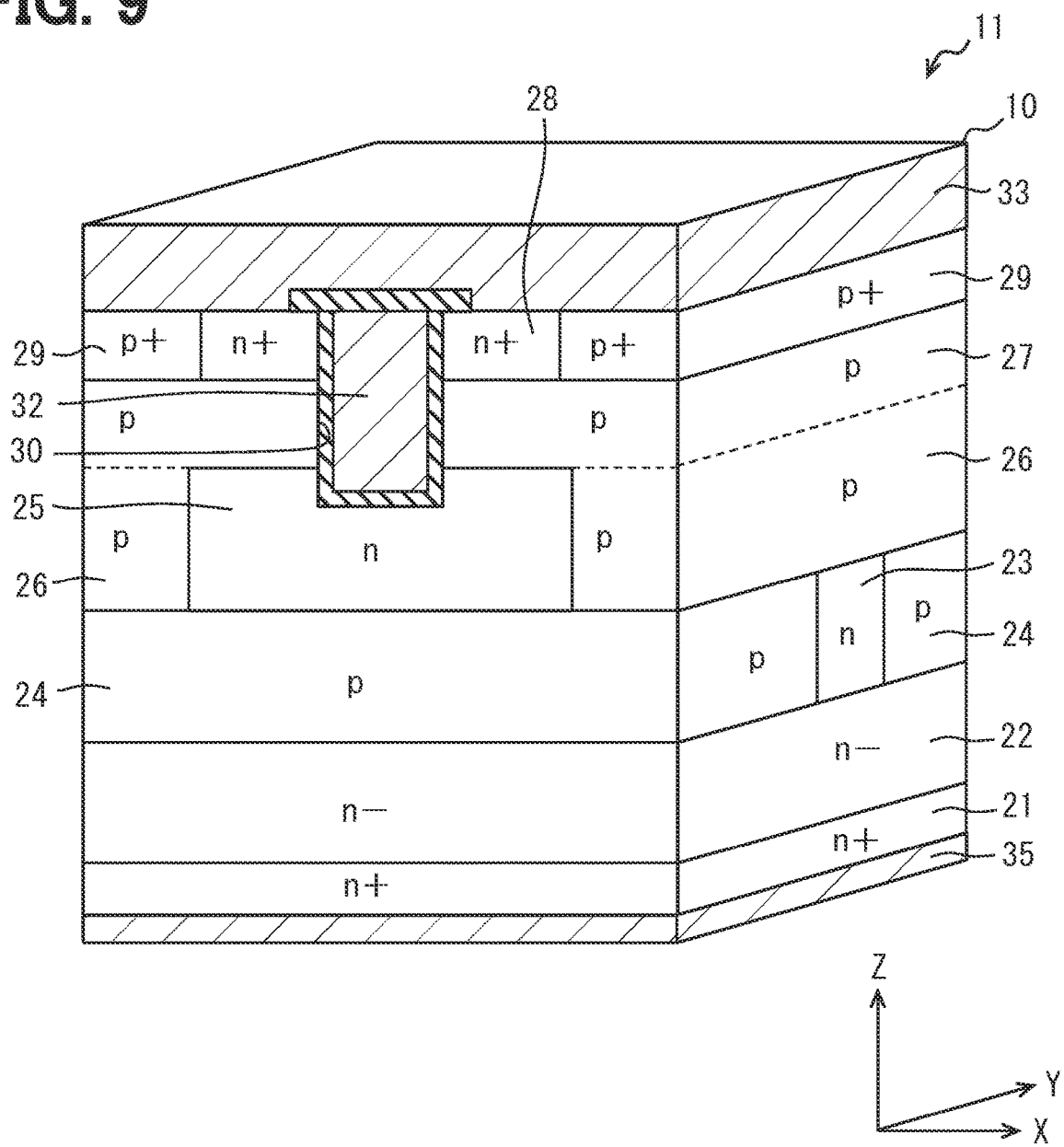
FIG. 9 is a partial cross-sectional view of a modification of the semiconductor element.

Although the above describes the JFET portion 23 extends in the same direction as the trench 30, in other words, the gate electrode 32, it is not limited to this example. As in the modification illustrated in FIG. 9, the JFET portion 23 extends in a direction orthogonal to the extending direction of the trench 30. FIG. 9 illustrates that the trench 30 extends in the Y direction, and the JFET portion 23 extends in the X direction. Even with such a structure, it is possible to reduce the turn-off loss while reducing the surge voltage with a simple structure to acquire the effect identical to the above.

Second Embodiment

A second embodiment is a modification of the preceding embodiment as a basic configuration and may incorporate description of the preceding embodiment. In the preceding embodiment, the power converter 4 includes the inverter 6 as the power conversion device. Alternatively, the converter with a function of raising voltage may also be further added.

Figure 10:
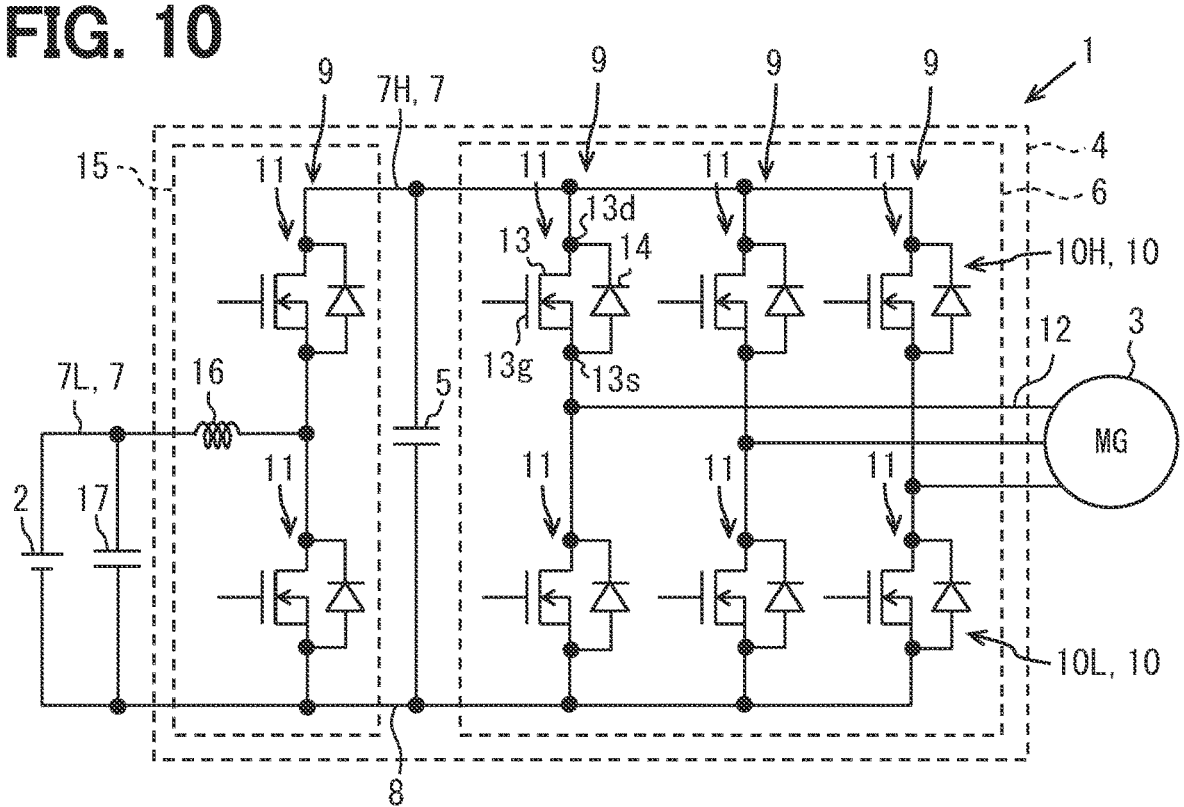
FIG. 10 illustrates a power converter according to a second embodiment.

FIG. 10 illustrates a circuitry structure of the power converter 4 according to the present embodiment. FIG. 10 illustrates the motor generator 3 in a simplified form for simplicity. The power converter 4 further includes a converter 15 as a power conversion device and a filter capacitor 17, in addition to the smoothing capacitor 5 and the inverter 6.

The converter 15 is a DC-DC converter that converts a direct current voltage into another direct current voltage with a different value. The converter 15 is disposed between the direct current power supply 2 and the smoothing capacitor 5. The converter 15 is a booster circuit having at least a function of raising the direct current voltage supplied from at least the direct current power supply 2. Further, the converter 15 may have a drop function of charging the direct current power supply 2 with use of the electric charges of the smoothing capacitor 5.

In the present embodiment, the inverter 6 has a structure identical to the preceding embodiment. Each of the upper-lower arm circuits 9 for the corresponding phase included in the inverter 6 has two semiconductor devices 11, in other words, two semiconductor elements 10. The P line 7 includes a VH line 7H and a VL line 7L. The upper-lower arm circuit 9 included in the inverter 6 is connected between the VH line 7H and the N line 8. The converter 15 includes a reactor 16 and the upper-lower arm circuit 9 in which two semiconductor devices 11, in other words, two semiconductor elements 10 are connected in series, as similar to the inverter 6.

The converter 15 as described above is capable of increasing or decreasing a voltage. The upper-lower arm circuit 9 in the converter 15 is connected between the VH line 7H and the N line 8. An end of the reactor 16 is connected to the VL line 7L, and the other end of the reactor 16 is connected to a connection node between two semiconductor elements 10 in the upper-lower arm circuit 9.

The filter capacitor 17 is connected between the VL line 7L and the N line 8. The filter capacitor 17 is connected to the direct current power supply 2 in parallel. For example, the filter capacitor 17 removes, for example, a power supply noise from the direct current power supply 2. Since the filter capacitor 17 is arranged on the lower voltage side as compared with the smoothing capacitor 5, the filter capacitor 17 is also referred to as a lower voltage capacitor.

Summary of Second Embodiment

The power converter 4 according to the present embodiment can enhance an input voltage of the inverter 6 through a boosting operation of the converter 15, when the motor generator 3 is required to generate a large output. The power converter 4 stops the boosting operation of the converter 15, when the motor generator 3 is required to generate a small output. By stopping the operation of the converter at the time of having frequent low output, the system as a whole can enhance fuel efficiency while coping with large output.

Figure 11:
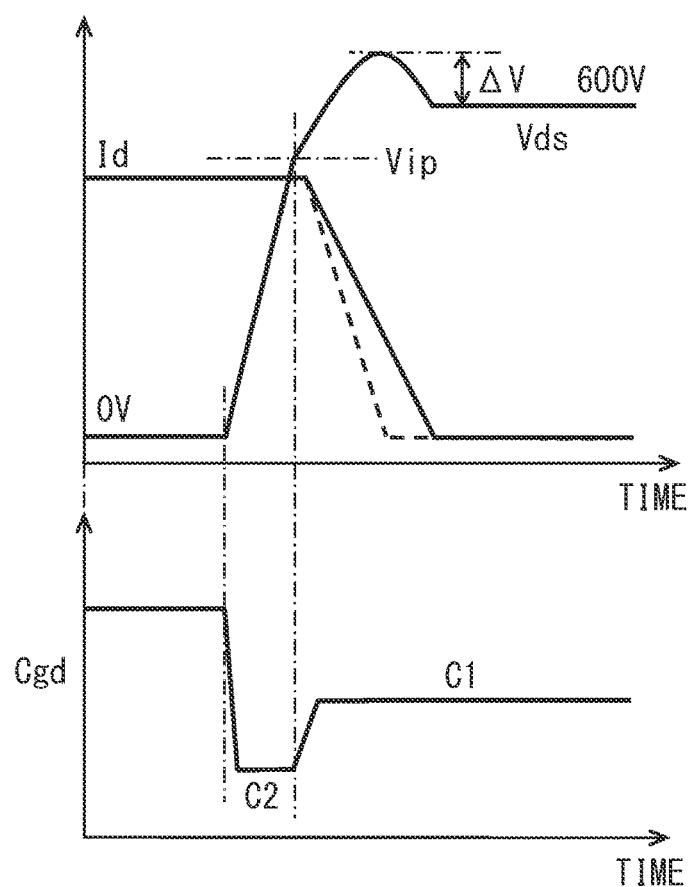
FIG. 11 illustrates a switching waveform when an input voltage is relatively high.

In the present embodiment, the semiconductor device 11, in other words, the semiconductor element 10 with the structure described in the preceding embodiment is adopted for the upper-lower arm circuit 9 in the inverter 6. For example, when the input voltage of the inverter 6 is 600 V, as illustrated in FIG. 11, the voltage Vds rises at the time of turn-off. When the voltage Vds reaches the inflection point voltage Vip, the capacitance Cgd increases to the capacitance value C1 from the capacitance value C2. This capacitance change reduces the switching speed di/dt. Therefore, the surge voltage $\Delta V$ can be reduced, as similar to the preceding embodiment.

Figure 12:
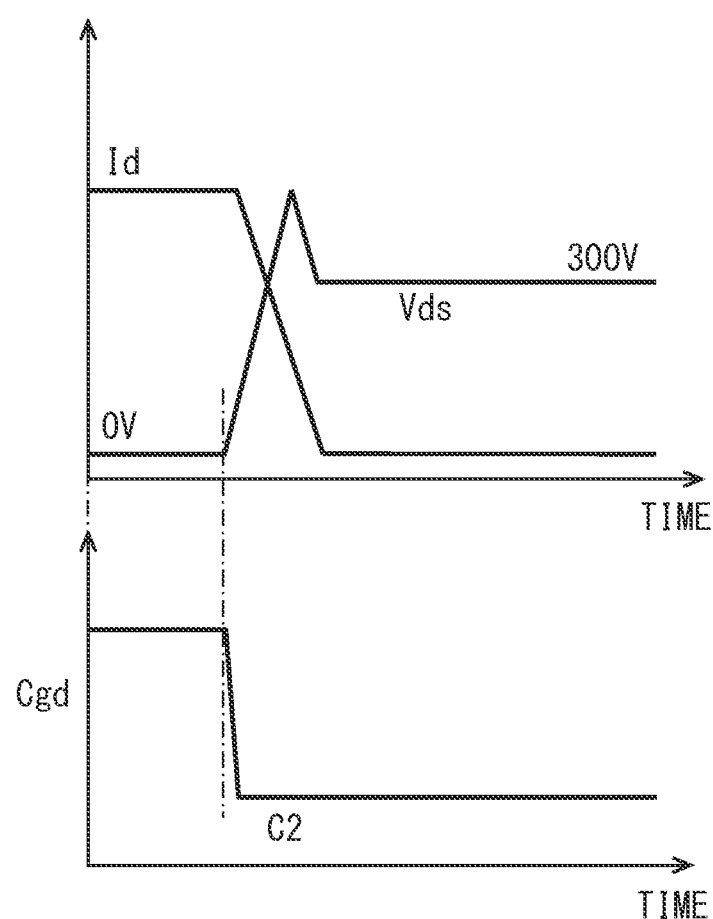
FIG. 12 illustrates a switching waveform when the input voltage is relatively low.

For example, when the input voltage of the inverter 6 is 300 V, as illustrated in FIG. 12, even though the voltage Vds rises at the time of turn-off, the capacitance Cgd does not suddenly increases since the voltage Vds does not reach the inflection point voltage Vip. As a result, the switching speed di/dt can be kept high. Accordingly, it is possible to reduce the turn-off loss in a state where a low input voltage occurs frequently during driving.

As described above, by applying the semiconductor element 10, in other words, the semiconductor device 11 having the characteristics described in the preceding embodiment to the inverter 6 of the power converter 4 having the function of raising voltage, it is possible to further enhance fuel efficiency while coping with large output. FIG. 11 illustrates 600 V as a high input voltage. However, it is not limited to this example. FIG. 12 illustrates 300 V as a low input voltage. However, it is not limited to this example. The output voltage of the converter 15 is not limited to 300 V and 600 V. The output voltage of the converter 15 is switchable in multiple levels.

The structure of the converter 15 is not limited to the above example. For example, in a situation of having only the function of raising voltage, the diode element may be adopted at the upper arm side of the upper-lower arm circuit 9. Although the above describes a single-phase converter, a multi-phase converter may be adopted.

The upper-lower arm circuit 9 of the converter 15 may include a semiconductor element, in other words, a switching element different from the semiconductor element 10, in other words, the MOSFET 13 described in the preceding embodiment. In the present embodiment, the upper-lower arm circuit 9 of the converter 15 has the semiconductor element 10, in other words, the semiconductor device 11 described in the preceding embodiment. Also in the semiconductor element 10 of the converter 15, the capacitance Cgd changes according to the voltage Vds. In addition to the above effect, even with the converter 15, it is possible to reduce the turn-off loss while reducing the surge voltage with a simple structure.

Other Embodiments

The disclosure in this specification, the drawings, and the like is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scopes are not limited to the description of the embodiments. It should be understood that a part of disclosed technical scopes are indicated by claims, and the present disclosure further includes modifications within an equivalent scope of the present disclosure.

The disclosure in the specification, drawings and the like is not limited by the description of the present disclosure. The disclosures in the specification, the drawings, and the like encompass the technical ideas described in the claims, and further extend to a wider variety of technical ideas than those in the present disclosure. Therefore, various technical ideas can be extracted from the disclosure of the specification, the drawings and the like without being limited to the description of the present disclosure.

Spatial relative terms "inside", "outside", "rear", "bottom", "low", "top", "high", and the like are used herein to facilitate the description that describes relationships between one element or feature and another element or feature. Spatial relative terms can be intended to include different orientations of a device in use or operation, in addition to the orientations illustrated in the drawings. For example, when a device in a drawing is turned over, elements described as "below" or "directly below" other elements or features are oriented "above" the other elements or features. Therefore, the term "below" can include both above and below. The device may be oriented in another direction (rotated 90 degrees or in any other direction) and the spatially relative terms used herein are interpreted accordingly.

The vehicle drive system 1 is not limited to the above structure described in the embodiments. Although the present disclosure describes that one motor generator 3 is provided, it is not limited to the example described in the present disclosure. Multiple motor generators may be provided. Although the above description mentions that the power converter 4 includes the inverter 6 as the power conversion device. For example, a structure with multiple inverters may also be adopted. Only the converter 15 may also be provided.

Although the above describes that the semiconductor device 11, in other words, the semiconductor element 10 is adopted in the inverter 6 or the converter 15, it is not limited to this example. It can be applied to at least one arm of the vertical circuit included in the power conversion device, in other words, a power conversion circuit.

The above describes that the semiconductor device 11 includes only one semiconductor element 10. However, it is not limited to this example. Multiple semiconductor elements 10 in the vertical circuit for one phase may be provided. Multiple semiconductor elements 10 in the vertical circuit for multiple phases may be provided.

What is claimed is:
1. A semiconductor device comprising:
a semiconductor element configured to form an upper-lower arm circuit of a power conversion device, wherein
the semiconductor element includes:
 a control electrode; and
 a high-potential electrode and a low-potential electrode being main electrodes, the high-potential electrode being at a higher potential than the low-potential electrode,
a parasitic capacitance between the control electrode and the high-potential electrode changes according to a potential difference between the high-potential electrode and the low-potential electrode,
a value of the parasitic capacitance at a time when the potential difference is equal to 80 percent of a breakdown voltage of the semiconductor element is defined as a first capacitance value,
an arbitrary value of the parasitic capacitance at a time when the potential difference is in an inclusive range of 20 percent to 40 percent of the breakdown voltage is defined as a second capacitance value, and
the first capacitance value is larger than the second capacitance value,
wherein
the semiconductor element further includes:
 a drain region being a first conductivity type;
 a low-concentration layer located on the drain region and being the first conductivity type, the low-concentration layer having a lower impurity concentration than the drain region;
 a junction-gate field-effect transistor (JFET) portion located on the low-concentration layer and being the first conductivity type, the JFET portion extending in a first direction orthogonal to a thickness direction of the semiconductor element, the JFET portion having a width smaller than a width of the low-concentration layer in a second direction orthogonal to the thickness direction and the first direction;
 a current dispersion layer located on the JFET portion and being the first conductivity type, the current dispersion layer having a width larger than the width of the JFET portion in the second direction;
 a second-conductivity-type region being a semiconductor region located on the low-concentration layer, the second-conductivity-type region being a second conductivity type and sandwiching the JFET portion in the second direction, the second-conductivity-type region located also on the current dispersion layer while surrounding the current dispersion layer;

a source region located on the second-conductivity-type region and being the first conductivity type, the source region having a higher impurity concentration than the low-concentration layer;

a gate electrode being the control electrode, the gate electrode having a trench structure penetrating the source region and the second-conductivity-type region and reaching the current dispersion layer;

a source electrode being one of the main electrodes, the source electrode electrically connected to the source region; and a drain electrode being another one of the main electrodes, the drain electrode electrically connected to the drain region, and the width of the JFET portion is equal to or larger than $591.53 \times BV^{-0.997}$, where BV denotes the breakdown voltage.

2. The semiconductor device according to claim 1, wherein a ratio of the first capacitance value to the second capacitance value is larger than or equal to 2.

3. The semiconductor device according to claim 1, wherein the width of the JFET portion is equal to or smaller than $278.52 \times BV^{-0.767}$.

4. The semiconductor device according to claim 1, wherein the power conversion device includes an inverter.

5. The semiconductor device according to claim 4, wherein the inverter is configured to convert a direct current voltage output by a booster circuit to an alternating current voltage.

6. The semiconductor device according to claim 1, further comprising:

a substrate made of a wide-bandgap semiconductor having a wider bandgap than silicon, wherein the semiconductor element is located at the substrate.

7. A semiconductor device comprising:

a semiconductor element configured to form an upper-lower arm circuit of a power conversion device, wherein the semiconductor element includes:
a control electrode; and
a high-potential electrode and a low-potential electrode being main electrodes, the high-potential electrode being at a higher potential than the low-potential electrode, a parasitic capacitance between the control electrode and the high-potential electrode changes according to a potential difference between the high-potential electrode and the low-potential electrode, a value of the parasitic capacitance at a time when the potential difference is equal to 80 percent of a breakdown voltage of the semiconductor element is defined as a first capacitance value, an arbitrary value of the parasitic capacitance at a time when the potential difference is in an inclusive range of 20 percent to 40 percent of the breakdown voltage is defined as a second capacitance value, and the first capacitance value is larger than the second capacitance value, wherein the power conversion device includes a converter configured to raise a direct current voltage supplied from a direct current power supply.

8. A semiconductor device comprising:

a semiconductor element configured to form an upper-lower arm circuit of a power conversion device, wherein the semiconductor element includes:
a drain region being a first conductivity type;

a low-concentration layer located on the drain region and being the first conductivity type, the low-concentration layer having a lower impurity concentration than the drain region;

a junction-gate field-effect transistor (JFET) portion located on the low-concentration layer and being the first conductivity type, the JFET portion extending in a first direction orthogonal to a thickness direction of the semiconductor element, the JFET portion having a width smaller than a width of the low-concentration layer in a second direction orthogonal to the thickness direction and the first direction;

a current dispersion layer located on the JFET portion and being the first conductivity type, the current dispersion layer having a width larger than the width of the JFET portion in the second direction;

a second-conductivity-type region being a semiconductor region located on the low-concentration layer, the second-conductivity-type region being a second conductivity type and sandwiching the JFET portion in the second direction, the second-conductivity-type region located also on the current dispersion layer while surrounding the current dispersion layer;

a source region located on the second-conductivity-type region and being the first conductivity type, the source region having a higher impurity concentration than the low-concentration layer;

a gate electrode having a trench structure penetrating the source region and the second-conductivity-type region and reaching the current dispersion layer;

a source electrode electrically connected to the source region; and a drain electrode electrically connected to the drain region, and the width of the JFET portion is equal to or larger than $591.53 \times BV^{-0.997}$ and smaller than or equal to $278.52 \times BV^{-0.767}$, where BV denotes a breakdown voltage of the semiconductor element.

9. The semiconductor device according to claim 8, wherein the power conversion device includes an inverter.

10. The semiconductor device according to claim 9, wherein the inverter is configured to convert a direct current voltage output by a booster circuit to an alternating current voltage.

11. The semiconductor device according to claim 8, wherein the power conversion device includes a converter configured to raise a direct current voltage supplied from a direct current power supply.

12. The semiconductor device according to claim 8, further comprising:

a substrate made of a wide-bandgap semiconductor having a wider bandgap than silicon, wherein the semiconductor element is located at the substrate.

\* \* \* \* \*